United States Patent [19]

Roth et al.

[11] Patent Number: 4,888,402
[45] Date of Patent: Dec. 19, 1989

[54] COPOLYMES FORMED FROM N-HYDROXYPHENYLMALEINIMIDE (DERIVATIVES) AND ALLYL COMPOUNDS

[75] Inventors: Martin Roth, Giffers; Peter Flury, Himmelried; Sameer H. Eldin, Fribourg, all of Switzerland

[73] Assignee: Ciba-Geigy Corporation, Ardsley, N.Y.

[21] Appl. No.: 79,056

[22] Filed: Jul. 29, 1987

[30] Foreign Application Priority Data

Aug. 6, 1986 [CH] Switzerland ............................ 3156/86

[51] Int. Cl.[4] ............................................. C08F 22/40
[52] U.S. Cl. ............................................................. 526/262
[58] Field of Search ........................................ 526/262

[56] References Cited

U.S. PATENT DOCUMENTS

| | | | |
|---|---|---|---|
| 3,265,708 | 8/1966 | Stiteler | 526/262 |
| 4,155,955 | 5/1979 | Parks | 525/260 |
| 4,173,592 | 11/1979 | Suzuki et al. | 525/134 |
| 4,205,151 | 5/1980 | Dale et al. | 526/262 |
| 4,289,699 | 9/1981 | Oba et al. | |
| 4,463,147 | 7/1984 | Diethelm et al. | 526/261 |
| 4,609,705 | 9/1986 | Crivello et al. | 526/262 |

FOREIGN PATENT DOCUMENTS

| | | | |
|---|---|---|---|
| 49-28697 | 3/1974 | Japan | 526/262 |
| 49-28673 | 7/1974 | Japan | 526/262 |
| 56-22311 | 3/1981 | Japan | 526/262 |
| 924730 | 5/1963 | United Kingdom . | |

OTHER PUBLICATIONS

C.A. 71, 61815g (1969).
C.A. 78, 16624c (1973).
C.A. 72, 21964u (1970).
S. R. Turner, et al., Photopolymer Conference, Ellenville, N.Y. Oct. 28-30, 1985.
Yocum/Nyquist "Functional Monomers", vol. 1, Marcel Dekker, New York, 1975, pp. 384-385.
C.A., 104, 16969e (1986).

Primary Examiner—Joseph L. Schofer
Assistant Examiner—N. Sarafin
Attorney, Agent, or Firm—Harry Falber

[57] ABSTRACT

The invention relates to copolymers consisting of 30-100 mol %, relative to the total polymer, of structural units of the formulae I and II, the proportion of structural units of the formula I, relative to the proportion of I and II, being 5 to 95 mol %,

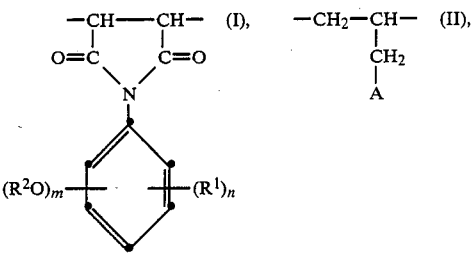

in which $R^1$ is $C_1$-$C_4$-alkyl, $C_1$-$C_4$alkoxy or halogen, $R^2$ is hydrogen or $-COR^3$ and $R^3$ is $C_1$-$C_{20}$alkyl, m is 1, 2 or 3, n is 0, 1, 2, 3 or 4 and the sum of m and n is not more than 5, and A is selected from the group of radicals consisting of halogen, cyano or structural units of the formulae III to VIII

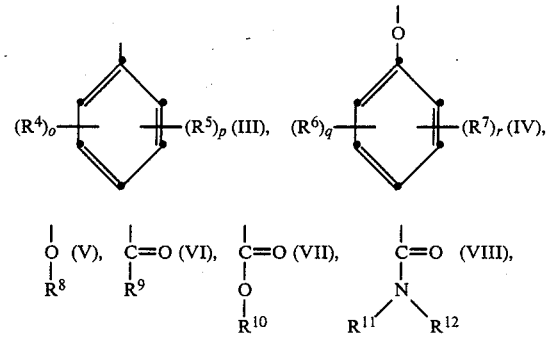

in which $R^4$ and $R^6$ independently of one another are hydroxyl,

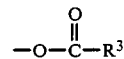

or glycidyl groups of the formula IXa or IXb

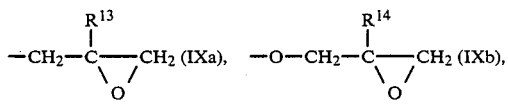

$R^5$ and $R^7$ independently of one another are $C_1$-$C_4$alkyl, $C_1$-$C_4$-alkoxy or halogen, o and q independently of one another are 0, 1, 2 or 3, p and r independently of one another are 0, 1,2,3, 4 or 5, it being necessary for the totals o+p and q+4 to be not more than 5, $R^8$ is hydrogen, $C_1$-$C_{20}$-alkyl, a glycidyl radical of formula IXa or a radical of formula VI, $R^9$ is hydrogen, $C_1$-$C_{20}$-alkyl, cycloalkyl having 5-7 ring C atoms, phenyl, naphthyl or benzyl, $R^{10}$ is hydrogen, $C_1$-$C_{20}$ - or a glycidyl radical of the formula IXa, and the groups $R^{11}$ and $R^{12}$ independently of one another are hydrogen, $C_1$-$C_{20}$-alkyl, cycloalkyl having 5-7 ring C atoms, aryl or aralkyl which is substituted or unsubstituted or a glycidyl radical of the formula IXa, or, together with the common nitrogen atom, form a five-membered or six-membered, non-aromatic, heterocyclic ring, and $R^{13}$ and $R^{14}$ independently of one another are hydrogen or methyl, it being possible for the radicals $R^1$ to $R^{14}$ and A of a polymer molecule to be different, within the definitions given.

The compounds are distinguished by high glass transition temperatures and good flexibility and can be employed as binders in photoresist systems. The representatives containing glycidyl groups can also be used as self-crosslinking epoxide resins.

7 Claims, No Drawings

COPOLYMES FORMED FROM N-HYDROXYPHENYLMALEINIMIDE (DERIVATIVES) AND ALLYL COMPOUNDS

The present invention relates to novel copolymers formed from N-hydroxyphenylmaleinimide (derivatives) and allyl compounds, to a process for the preparation of these polymers to the use of these compounds as binders for photoresists or epoxide curing agents and to the use, as self-crosslinking resins, of the representatives of these compounds which contain epoxide groups.

Homopolymers of 4-substituted phenylmaleinimides are known, for example from Kobunshi Kagaku 26, 393–400 (1969) (Chem. Abstr. 71, 61815 g). Homopolymers of N-(4-hydroxyphenyl)-maleinimides are disclosed in Belgian Patent Specification 613,801. Copolymers formed from N-hydroxyphenylmaleinimide and (meth)acrylic acid derivatives or other vinyl monomers have also already been reported, for example in Kobunshi Kagaku 29, 643–7 (1972) and 26, 593–601 (1969) (Chem. Abstr. 78, 16,62c and 72, 21,964u) or by S. R. Turner et al. in photopolymer conference, Ellenville, USA, Oct. 22–30, 1985.

It is known that the glass transition temperature of vinyl copolymers can be raised by incorporating N-hydroxyphenylmaleinimides. It is possible to employ resins of this type as binders in positive photosensitive resists (compare Turner et al.).

However, the binders which are customarily used in positive resists cannot, as a rule, be employed in negative resists. Hitherto, polyphenols in particular, for example novolaks based on phenol and formaldehyde, have been employed in positive resists, but not in negative resists. Surprisingly, the N-hydroxyphenylmaleinimide copolymers according to the invention can be used both in positive resists and also in negative resists. Aqueous alkaline negative systems which can be developed and have a high heat stability and dimensional stability can be prepared in this way.

It has now been found that the flexibility of N-hydroxyphenylmaleinimide polymers can be improved by incorporating allyl monomers in the polymer skeleton. In addition, a subgroup of polymers of this type has been found which contain, at the same time and in a single molecule, a phenolic hydroxyl group and a clycidyl radical and which can be employed as self-crosslinking epoxide resins.

It is also known that allyl compounds can only be polymerized with relative difficulty (compare Yocum/Nyquist, "Functional Monomers", Vol. 1, 384 et seq, Marcel Dekker Inc., New York, 1975). It was therefore surprising to find that the polymerization of N-hydroxyphenylmaleinimides with allyl compounds proceeds rapidly and under mild conditions and that it is possible to reach relatively high molecular weights.

The present invention relates to copolymers containing 30–100 mol%, relative to the total polymer, of structural units of the formulae I and II, the proportion of structural units of the formula I, relative to the total proportion of I and II, being 5 to 95 mol%,

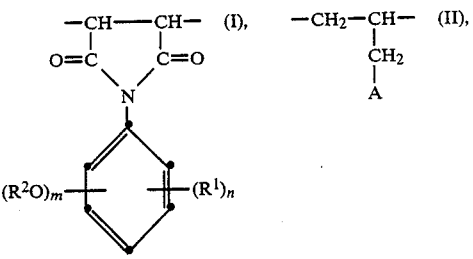

in which $R^1$ is $C_1$–$C_4$-alkyl, $C_1$–$C_4$-alkoxy or halogen, $R^2$ is hydrogen or $-COR^3$ and $R^3$ is $C_1$–$C_{20}$-alkyl, m is 1, 2 or 3, n is 0, 1, 2, 3 or 4 and the sum of m and n is not more than 5, and A is selected from the group of radicals consisting of halogen, cyano or structural units of the formulae III to VIII

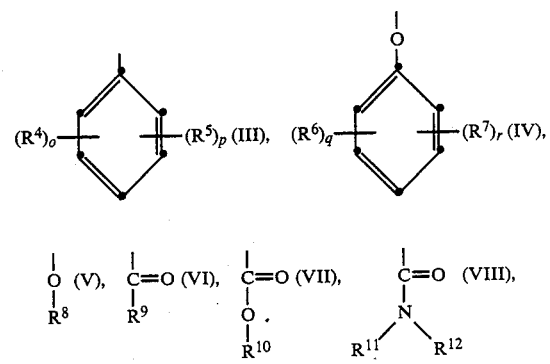

in which $R^4$ and $R^6$ independently of one another are hydroxyl,

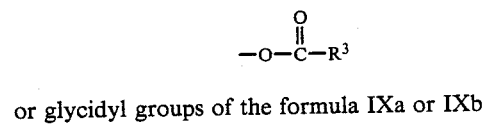

or glycidyl groups of the formula IXa or IXb

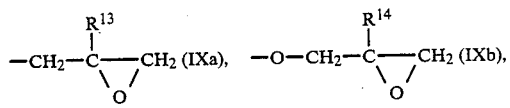

$R^5$ and $R^7$ independently of one another are $C_1$–$C_4$-alkyl, $C_1$–$C_4$-alkoxy or halogen, o and q independently of one another are 0, 1, 2 or 3, p and r independently of one another are 0, 1, 2, 3, 4 or 5, it being necessary for the totals o+p and q+r to be not more than 5, $R^8$ is hydrogen, $C_1$–$C_{20}$-alkyl, a glycidyl radical of formula IXa or a radical of formula VI, $R^9$ is hydrogen, $C_1$–$C_{20}$-alkyl, cycloalkyl having 5–7 ring C atoms, phenyl, naphthyl or benzyl, $R^{10}$ is hydrogen, $C_1$–$C_{20}$-alkyl or a glycidyl radical of the formula IXa, and the groups $R^{11}$ and $R^{12}$ independently of one another are hydrogen, $C_1$–$C_{20}$-alkyl, cycloalkyl having 5–7 ring C atoms, aryl which is substituted or unsubstituted or a glycidyl radical of the formula IXa, or, together with the common nitrogen atom, form a five-membered or six-membered, non-aromatic, heterocyclic ring, and $R^{13}$ and $R^{14}$ independently of one another are hydrogen or me;thyl, it being possible for the radicals $R^1$ to $R^{14}$ and A of a polymer molecule to be different, within the definitions given.

As $C_1$–$C_4$-alkyl, $R^1$, $R^5$ or $R^7$ are linear or branched, preferably linear, alkyl radicals. Examples of such groups are methyl, ethyl, n-propyl, iso-propyl, n-butyl or sec.-butyl. Methyl is preferred.

As $C_1$–$C_4$-alkoxy, the alkyl moiety of $R^1$, $R^5$ and $R^7$ is as defined in the examples above. Methoxy is preferred.

As halogen, $R^1$, $R^5$ or $R^7$ are fluorine, chlorine, bromine or iodine. Chlorine or bromine is preferred, especially bromine.

$C_1$–$C_{20}$-alkyl radicals are preferably linear groups. They can, however, also be branched alkyl groups.

Examples of $C_1$–$C_{20}$-alkyl radicals are methyl, ethyl, n-propyl, iso-propyl, n-butyl, sec.-butyl, tert.-butyl, n-pentyl, isoamyl, n-hexyl, n-heptyl, n-octyl, 2-ethylhexyl, n-nonyl, n-decyl, n-undecyl, n-dodecyl, n-tetradecyl, n-hexadecyl, n-octadecyl or n-eicosyl. $C_1$–$C_8$-alkyl radicals of this type are preferred, especially the linear radicals and very particularly methyl or ethyl.

As halogen, A is fluorine, chlorine, bromine or iodine. Chlorine or bromine is preferred, especially chlorine.

As cycloalkyl having 5–7 ring C atoms, $R^9$, $R^{11}$ and $R^{12}$ are, as a rule, cyclopentyl, cyclohexyl or cycloheptyl, but particularly cyclohexyl. These radicals can have alkyl substituents.

Examples of $R^{11}$ or $R^{12}$ as substituted or unsubstituted aryl are phenyl or naphthyl. Examples of possible substituents are alkyl groups, in particular methyl, alkoxy groups, in particular methoxy, halogen atoms, in particular chlorine or bromine, or cyano groups.

Specific examples of substituted aryl radicals are o-, m- or p-tolyl, xylyl or chlorophenyl. Phenyl is preferred.

Examples of $R^{11}$ or $R^{12}$ as substituted or unsubstituted aralkyl are benzyl, α-methylbenzyl or α,α-diemthylbenzyl. Here too possible substituents are the radicals mentioned above as examples of aryl.

Specific examples of substituted aralkyl radicals are 4-methylbenzyl or 4-methoxybenzyl. Benzyl is preferred.

If $R^{11}$ and $R^{12}$, together with the common nitrogen atom, form a five-membered or six-membered, non-aromatic, heterocyclic ring, this is, for example, piperidyl, pyrrolidinyl or morpholinyl.

Preferred copolymers, as defined above, are those in which the proportion of the structural units I and II is 50–100 mol%, relative to the total polymer.

Copolymers consisting essentially of structural elements of the formulae I and II are very particularly preferred. The term "essentially" is to be understood as meaning a content of structural elements of the formulae I and II such that, compared with a polymer consisting solely of the corresponding structural units I and II, no appreciable difference in the thermal, electrical and mechanical properties of the polymer result.

Copolymers consisting solely of structural elements of the formulae I and II are particularly preferred.

Copolymers, as defined above, which are also preferred are those in which the proportion of radicals of the formula I, relative to the proportion of I and II, is 10–80 mol%, particularly preferentially 30–75 mol%.

Copolymers containing structural units of the formulae I and II in which $R^2$ is hydrogen are also preferred. These are copolymers containing N-hydroxyphenylmaleinimide radicals as a monomer unit.

Copolymers which are also preferred are those containing the structural units of the formula I and II in which $R^2$ is hydrogen and A is selected from the group of radicals of the formulae III, IV, V, VII and VIII, $R^4$ and $R^6$ are glycidyl groups of the formulae IXa or IXb, $R^8$, $R^{10}$ and at least one of the radicals $R^{11}$ or $R^{12}$ are a glycidyl group of the formula IXa, and o and q independently of one another are 1, 2 or 3.

Copolymers which are very particularly preferred are those containing the structural units of the formulae I and II, preferably formulae in which m=1 and n=0, in which $R^2$ is hydrogen, A is a radical of formula V and $R^8$ is a group of the formula IXa. Copolymers which are also particularly preferred are those containing structural units of the formulae I and II, preferably formulae in which m=1 and n=0, in which $R^2$ is hydrogen, A is a group of the formulae III or IV, $R^4$ and $R^6$ are glycidyl groups of the formula IXb, o and q are 1 or 2, especially 1, and p and r are 0.

The index m is preferably 1 or 2, particularly 1. The index n is preferably 0, 1 or 2, but particularly 0 or 1 and very particularly 0. The indices o and q are preferably 0 or 1, particularly preferably 0. In the case of comonomers containing glycidyl radicals, they are preferably 1. The indices q and r are preferably 0 or 1, particularly 0.

Copolymers which are also preferred are those having the structural units of the formula I and II in which $R^2$ is hydrogen, m is 1, n is 0, 1 or 2, A is selected from the group consisting of the radicals of the formulae III, IV or V, and $R^8$ is $C_1$–$C_4$-alkyl or a radical of the formula VI in which $R^9$ is $C_1$–$C_4$-alkyl.

Surprisingly, the copolymers according to the invention can be prepared under mild conditions in a high yield and with relatively high molecular weights ($M_n$: 500–100,000).

The invention therefore also relates to a process for the preparation of these copolymers, which comprises (a) subjecting to free-radical polymerization compounds of formula Ia and IIa

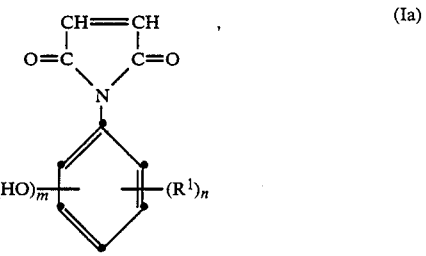

(Ia)

(IIa)

in which $R^1$, A, m and n are as defined earlier in the text, if appropriate in the presence of further monomers which can be polymerized by free radicals, and, if desired, reacting the product further with a reagent capable of introducing the radical $R^3$—CO—, but preferably not carrying out a further reaction with the said reagent, or (b) subjecting to free-radical polymerization compounds of the formula Ib and IIa

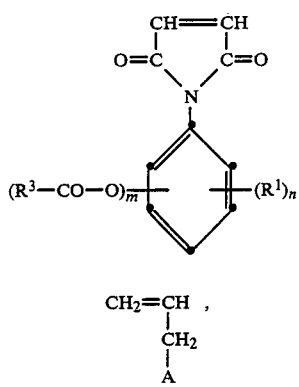

$$\text{(Ib)}$$

$$\begin{array}{c} CH_2=CH \\ | \\ CH_2 \\ | \\ A \end{array} \quad \text{(IIa)}$$

in which $R^1$, $R^3$, A, m and n are as already defined earlier in the text, if appropriate in the presence of further monomers which can be polymerized by free radicals, and, if desired, converting the product into another copolymer of the definition given earlier in the text by (partial) hydrolysis of the $R^3$—CO— group. In variant (b) of the process according to the invention, it is preferable to carry out complete hydrolysis of the radical $R^3$—CO—.

A further preference in process variant (b) relates to the use of allyl compounds IIa containing glycidyl groups, and particularly preferably to the use of allyl compounds in which A is a radical of the formula V and $R^8$ is a group of the formula IXa, or in which A is a radical of the formula III or IV, $R^4$ and $R^6$ are glycidyl groups of the formula IXb, o and q are 1 or 2 and p and r are 0. The compounds of the formulae Ia and Ib are known per se or can be prepared by standard reactions. These compounds and their preparation are described, for example, in U.S. Pat. No. 4,289,699.

The allyl compounds of the formulae IIa are also known and in some cases are commercially available.

In addition to the monomers of the formulae Ia and IIa or Ib and IIa, it is also possible, if desired, for further monomers which can be polymerized by free radicals to be present. These are to be understood as meaning, in particular, vinyl compounds.

The following are examples of monomers of this type:

(a) styrene compounds, for example styrene, α-methylstyrene, p-methylstyrene or p-hydroxyphenylstyrene;

(b) α,β-unsaturated acids and esters or amides thereof, for example acrylic acid, methyl acrylate, acrylamide, the corresponding methacrylic compounds, maleic acid or methyl maleiate;

(c) nitriles of α,β-unsaturated acids, for example acrylonitrile or methacrylonitrile;

(d) vinyl compounds containing halogens, for example vinyl chloride, vinyl fluoride, vinylidene chloride or vinylidene fluoride;

(e) vinyl esters, for example vinyl acetate, or (f) vinyl ethers, for example methyl vinyl ether or butylvinyl ether.

These monomers can, however, also be olefins, for example ethylene or propylene.

It is also possible to employ mixtures of these monomers.

The preparation of the copolymers is effected by free-radical polymerization of the appropriate mixture of monomers by means of heat or actinic radiation. In this process it is preferable to employ the allyl monomers of the formula IIa in excess, since the N-hydroxyphenylmaleinimide (derivative) of the formula Ia or Ib has a tendency to polymerize preferentially with itself. The comonomer ratio can be controlled as desired by choosing a suitable excess of the allyl compound. As a rule, excess allyl monomer must be removed from the copolymer after the reaction. This is carried out in a manner known per se, for example by precipitating the copolymer in a non-solvent. As a rule, the polymerization is initiated by one of the initiators customary for free-radical polymerization.

These include thermal initiators, such as azo compounds, for example azoisobutyronitrile (AIBN), or peroxides, for example benzoyl peroxide, or redox initiator systems, such as a mixture of iron(III) acetyl acetonate, benzoin and benzoyl peroxide, or photochemical free-radical formers, such as benzoin or benzil methyl ketal.

The copolymerization can be carried out in solution. The reaction temperature generaly varies within the range from 10° to 200° C., preferably between 40° and 150° C. and particularly preferably between 40° and 100° C.

The solvents which may be present must be inert under the conditions of the reaction. Suitable solvents are, inter alia, aromatic hydrocarbons, chlorinated hydrocarbons and ketones. Examples of these are benzene, toluene, xylene, ethylbenzene, isopropylbenzene, ethylene chloride, propylene chloride, methylene chloride, chloroform, methyl ethyl ketone, acetone or cyclohexanone.

The reaction conditions, in particular the choice of initiator and solvent, are generally known and are described in detail in the literature (for example in Houben-Weyl, Methoden der organischen Chemie ("Method of Organic Chemistry"), volume 14/1, pages 24–110; G. Thieme Verlag 1961).

The polymerization processes used are the customary processes, for example polymerization in bulk or in solvents, emulsion polymerization, suspension polymerization or precipitation polymerization.

So-called statistical copolymers, i.e. polymers in which the sequence of the individual monomer units is random, are formed under the reaction conditions selected. The moleculare weight of the products ($\overline{M}_n$; determined by gel permeation chromatography) as a rule varies between about 500 and 100,000, in particular between 1,000 and 50,000.

The copolymers according to the invention are solid products, soluble in numerous organic solvents, for example in ketones or esters. If the proportion of structural units of the formula I having phenolic hydroxyl groups is large enough, the copolymers can even dissolve in water, preferably in aqueous alkaline media.

A reagent capable of introducing the radical $R^3$—CO—, by means of which the product of the polymerization of the monomers Ia and IIa is, if desired, reacted further, is to be understood as meaning, very generally, an acylating agent, particularly carboxylic acids or activated derivatives thereof, for example the corresponding acetyl chlorides, in particular acetyl chloride.

The polymerization of the monomers Ib and IIa is followed, if desired, by a hydrolysis stage. In this, the acyl group of the N-phenylmaleinimidyl radical is split off. The scission is effected by methods which are customary per se, for example by hydrolysis in an acid or basic medium. A reaction sequence of this type is described by S. R. Turner et al in "Photopolymer Conference, Ellenville USA (28–30 October 1985), pages 35–47".

The copolymers according to the invention are used, for example, as binders for positive and negative photoresist systems. It is preferable to employ for this purpose the derivatives containing N-(hydroxyphenyl)-maleinimide units. These compounds can be developed in aqueous alkaline solutions by virtue of their content of phenolic hydroxyl groups, and this invention also relates to their use as binders for photoresists.

The copolymers make it possible to prepare heat-resistant resist images having good resolution, since they generally have relatively high glass transition temperatures ($T_g$), combined with good mechanical properties.

The use of the corresponding N-(hydroxyphenyl)-maleinimide/vinyl copolymers as binders in positive resists is described in the article by S. R. Turner et al quoted above.

The copolymers according to the invention are particularly suitable for use as binders for negative resist systems based on epoxide resins and cationic photoinitiators.

A further field of use of the N-(hydroxyphenyl)-maleinimide copolymers of the invention relate to their use as curing agents for epoxide resins.

The invention also relates to the use of N-(hydroxyphenyl)-maleinimide copolymers containing glycidyl-substituted allyl units of the formula II as self-crosslinking epoxide resins. The compounds contain, in one and the same molecule, both an epoxide group and a curing function (phenol).

They can, therefore, be crosslinked under the application of heat on their own or in combination with customary curing agents. They can, in particular, be cured by heat without further curing agents, preferably in the presence of customary accelerators. The copolymers of the present invention which contain glycidyl groups can, however, also be cured when mixed with further, customary heat-curing agents and, if desired, accelerators.

Suitable additional epoxide resins which can be employed as a mixture with the epoxide compounds according to the invention are the resins customarily employed in the technology of epoxide compounds.

These include, for example, polyglycidyl esters and poly-($\beta$-methylgycidyl) ester, polyglycidyl ethers and poly($\beta$-methylglycidyl) ethers, poly-(N-glycidyl) compounds, poly(S-glycidyl) compounds or cycloaliphatic epoxide resins.

Examples of the individual compounds of this type are given in EP-A 160,621.

Polyglycidyl ethers of bisphenols, for example of 2,2-bis-(4-hydroxyphenyl)-propane or bis-(4-hydroxyphenyl)methane, of novolaks or of aliphatic diols, are employed particularly together with the epoxide resins according to the invention.

Suitable epoxide curing agents are acid, basic or catalytic curing agents. These include, for example, amines or amides, such as aliphatic, cycloaliphatic or aromatic, primary, secondary or tertiary amines, for example hexamethylenediamine, N,N-diethylpropylenediamine, bis-(4-aminocyclohexyl)-methane, 3,5,5-trimethyl-3-(aminomethyl)-cyclohexylamine ("isophoronediamine"), 2,4,6-tris-(dimethylaminomethyl)phenol, p-phenylenediamine or bis-(4-aminophenyl)-methane; or polyamides, for example polyamides formed from aliphatic polyamines and dimerized or trimerized unsaturated fatty acids; or polyhydric phenols, for example resorcinol, 2,2-bis-(4-hydroxyphenyl)-propane or phenol/formaldehyde resins (phenol novolaks); or boron trifluoride and its complexes with organic compounds, for example $BF_3$/ether complexes or $BF_3$/amine complexes; or polybasic carboxylic acids and anhydrides thereof, for example phthalic anhydride, tetrahydrophthalic anhydride or hexahydrophthalic anhydride or the corresponding acids.

Curable mixture of this type can also contain suitable plasticizers, such as dibutyl phthalate, dioctyl phthalate or tricresyl phosphate, or reactive diluents, such as phenyl or cresyl glycidyl ethers, butanediol diglycidyl ethers or hexahydrophthalic acid diglycidyl ethers.

Finally, it is possible to add to the curable mixtures, in any phase before curing, extenders, fillers and reinforcing agents, for example coaltar, bitumen, textile fibres, glass fibres, asbestos fibres, boron fibres, carbon fibres, mineral silicates, mica, powdered quartz, hydrated aluminium oxide, bentonites, kaolin, silica aerogel or metal powders, for example aluminium powder or iron powder, and also pigments and dyestuffs, such as carbon black, oxide colorants, titanium dioxide and others. It is also possible to add, to the curable mixtures, other customary additives, for example fire-retarding agents, such as antimony trioxide, thixotropic agents, flow control agents, such as silicones, waxes or stearates (which are also used in part as mould release agents).

The preparation of the curable mixtures according to the invention can be effected in a customary manner by means of known mixing units (stirrers, kneaders, rolls etc.).

The curable epoxide resin mixtures according to the invention are used, in particular, in the fields of surface protection, electrical engineering, laminating processes and the building industry. They can be used in a formulation adjusted to suit each particular end use, in an unfilled or filled state, as paints, lacquers, such as sintering powder lacquers, compression moulding compositions, dipping resins, casting resins, injection moulding formulations, impregnating resins, adhesives, tooling resins, laminating resins, sealing and travelling compositions, floor covering compositions and binders for mineral aggregates.

The cured products prepared by means of the copolymers according to the invention, containing glycidyl groups, are distinguished by very good thermal, electrical and mechanical properties.

It is also possible to employ curing accelerators in the curing process; examples of accelerators of this type are tertiary amines and salts or quaternary ammonium compounds thereof, for example benzyldimethylamine, 2,4,6-tris(dimethylaminomethyl)-phenol, 1-methylimidazole, 2-ethyl-4-methylimidazole, 4-aminopyridin, tripentylammonium phenate or tetramethylammonium chloride; or alkali metal alcoholates, for example Na alcoholates of 2,4-dihydroxy-3-hydroxymethylpentane. It is advantageous to carry out the curing of the copolymers according to the invention, containing glycidyl groups, within the temperature range from 50° C. to 300° C., preferably 80° to 250° C.

The curing can also be carried out in a known manner in two or more stages, the first curing stage being carried out at a fairly low temperature and the subsequent curing at a higher temperature.

If desired, the curing can also be carried out in two stages by first prematurely terminating the curing reaction or carrying out the first stage at a fairly low temperature, whereby a curable precondensate which is still fusible and/or soluble (the so-called "B-stage") is obtained from the epoxy component (a) and the curing agent or accelerator (b) which may be present. A precondensate of this type can be used, for example, for the preparation of "prepregs", compression moulding compositions or sintering powders.

The term "curing", as used here, means the conversion of the soluble, either liquid or fusible, polyepoxides into solid, insoluble and infusible, three-dimensionally cross-linked products or materials, as a rule with simultaneous shaping to give shaped articles, such as cast articles, compression moulded articles and laminates, impregnations, coatings, paint films and adhesive bonds.

The following examples illustrate the invention in greater detail.

Preparation examples

EXAMPLE 1

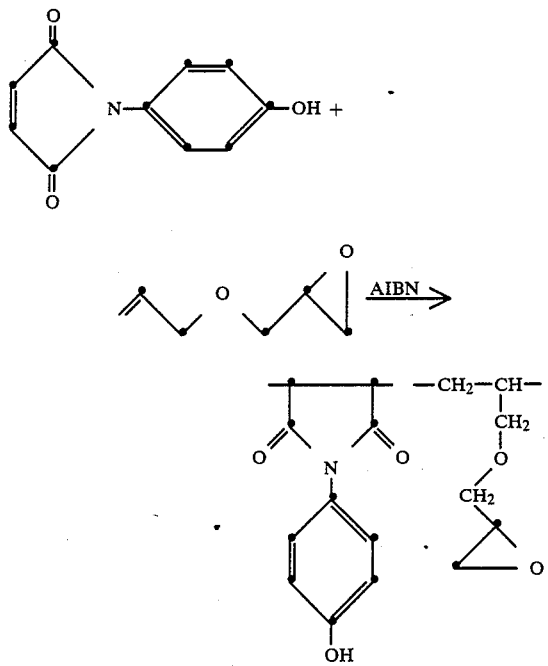

A 2.5 l sulfonation flask, equipped with a stirrer, a thermometer, a reflux condenser and an inlet and outlet for nitrogen, is charged with the following: 233.4 g (1.234 mol) of p-maleinimidylphenol, 1264.8 g (11.08 mol) of allyl glycidyl ether and 4.95 g (0.030 mol) of 60 ,α'-azobisisobutyronitrile (AlBN).

After blanketing with nitrogen, the suspension is heated by means of an oil bath, with stirring. Polymerization sets in at an internal temperature of approx. 70° C., with a considerable evolution of heat. The oil bath is removed and the flask is cooled with an ice bath for approx. 10 minutes. Heating with the oil bath is then continued for 7 hours at a temperature of approx. 70° C. The yellowish suspension is introduced into 4000 ml of toluene with vigorous stirring, and the precipitate is filtered off and dried in vacuo for 14 hours at 60° C. The solid product is dissolved in acetone and reprecipitated from toluene. Drying in vacuo leaves 427.9 g of a colourless, solid copolymer.

Elementary analysis

Found, %: C 63.52 H 5.88 N 3.94. Composition calculated on the basis of the N content: 2.83 mol/kg of maleinimidyl phenol.

$\overline{M}_w = 7664$
$\overline{M}_n = 4265$ } GPC[1] (polystyrene standards)

[1]Gel permeation chromatography

EXAMPLE 2

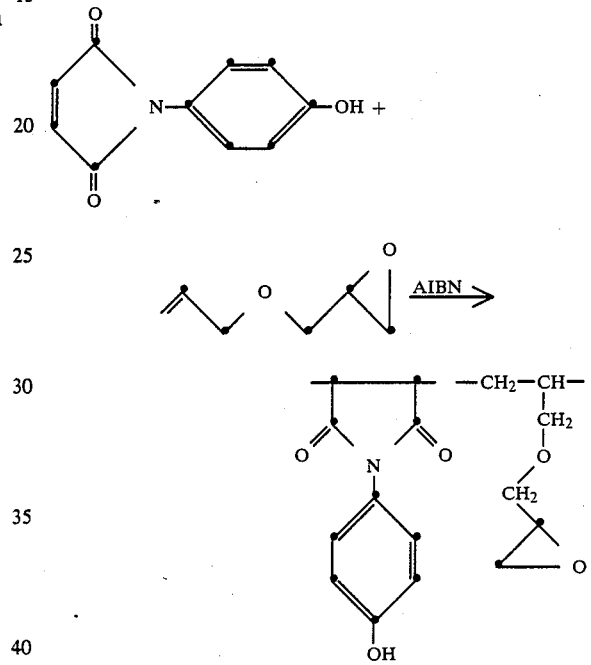

A 350 ml sulfonation flask, equipped as in Example 1, is charged with the following:
18.92 g (0.100 mol) of p-maleinimidylphenol,
11.42 g (0.100 mol) of allylglycidyl ether,
144.50 g of methyl ethyl ketone and
0.380 g (0.0023 mol) of α,α'-azobisisobutyronitrile (AIBN)

The mixture is blanketed with nitrogen and polymerized for 7 hours at approx. 70° C., as described in Example 1. The yellowish, clear solution is added dropwise to toluene with vigorous stirring, and the precipitate is filtered off and dried in vacuo at 60° C. After reprecipitating a solution in acetone again in toluene, 19.86 g of solid copolymer are left as powder after drying.

Elemental analysis

Found, %: C 60.33 H 4.90 N 6.07. Composition calculated from N content: 4.31 mol/kg of maleinimidylphenol.

$\overline{M}_w = 5670$
$\overline{M}_n = 3217$ } GPC (polystyrene standards)

EXAMPLE 3

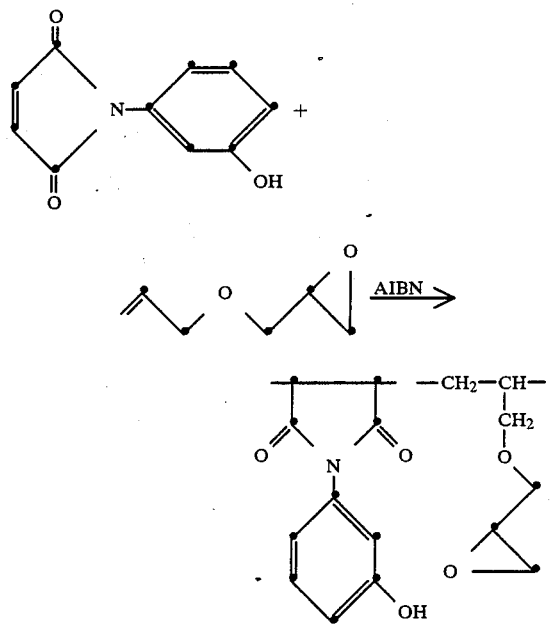

The following are polymerized analogously to the procedure of Example 1:
9.45 g (0.050 mol) of m-maleinimidylphenol,
51.15 g (0.448 mol) of allylglycidyl ether and
0.20 g (0.0012 mol) of α,α'-azobisisobutyronitrile (AIBN)
Reprecipitation with toluene leaves 14.88 g of a colourless, solid copolymer.

Elementary analysis

Found, %: C 62.63 H 5.83 N 4.27. Composition (calculated from N content): 3.07 mol/kg maleinimidylphenol.

$\overline{M}_w = 7732$
$\overline{M}_n = 4607$ } GPC (polystyrene standards)

EXAMPLE 4

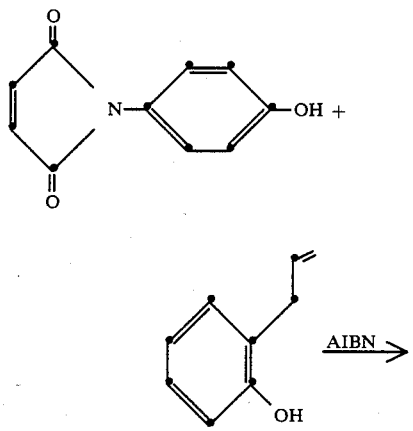

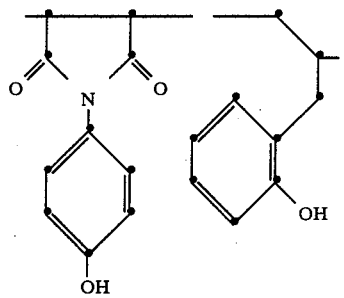

An apparatus consisting of a 100 ml three-necked round-bottomed flask, a magnetic stirrer, an oil bath, a thermometer, a condensor and a gas inlet tube and bubble counter is charged with the following:
9.45 g (50 mmol) of p-maleinimidylphenol,
40.25 g (300 mmol) of 2-allylphenol and
0.28 g (1.7 mmol) of α,α'-azobisisobutyronitrile (AIBN).

The reaction mixture is stirred for 24 hours at approx. 65° C. in a gentle stream of nitrogen. The yellowish suspension is then introduced slowly, with stirring, into 300 ml of either, and the precipitate is filtered off and washed with approx. 200 ml of ether. Drying leaves 12.3 g of a colourless powder.

Elementary analysis

Found, %: C 68.12 H 5.68 N 4.40. Composition (calculated from N content): 3.15 mol/kg maleinimidylphenol.

Content of phenolic OH: 5.56 mol/kg.

$\overline{M}_w = 4154$
$\overline{M}_n = 3004$ } GPC (polystyrene standard)

EXAMPLE 5

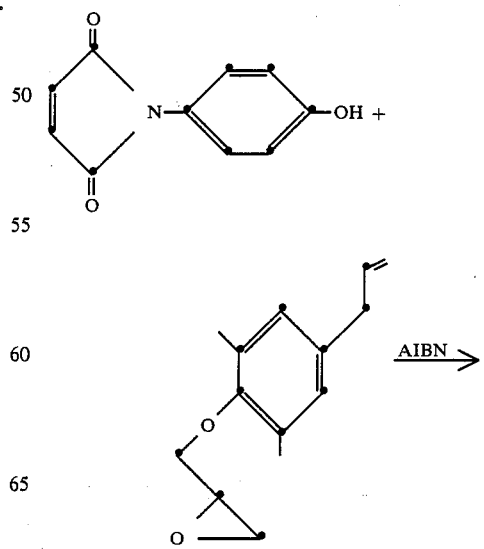

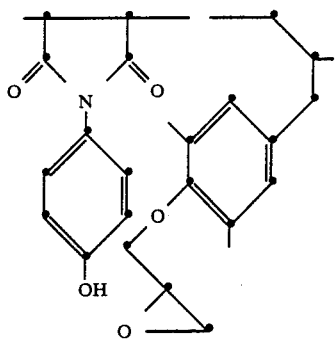

An apparatus consisting of a 1 l three-necked round-bottomed flask, a magnet stirrer, an oil bath, a thermometer, a condensor and a gas inlet tube and bubble counter is charged with the following:

18.92 g (100 mmol) of p-maleinimidylphenol,
65.49 g (300 mmol) of 2,6-dimethyl-4-allylphenyl glycidyl ether,
0.38 g (2.3 mmol) of α,α'-azobisisobutyronitrile (AIBN) and
420 ml of tetrahydrofuran.

The reaction mixture is heated for 24 hours at approx. 65° C. in a gentle stream of nitrogen. The yellowish suspension is then introduced slowly, with stirring, into 1 l of ether, and the precipitate is filtered and washed with approx. 200 ml of ether. Drying leaves 17.0 g of a colourless powder.

Elemental analysis

Found, %: C 66.83 H 5.78 N 4.65. Composition (calculated from N content): 4.14 mol/kg maleinimidylphenol.

$\overline{M}_w = 3503$
$\overline{M}_n = 2342$ } GPC (polystyrene standards)

EXAMPLE 6

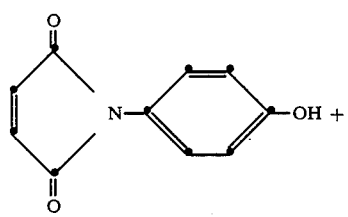

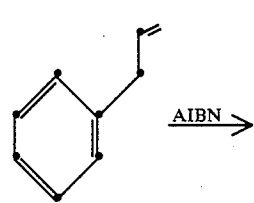

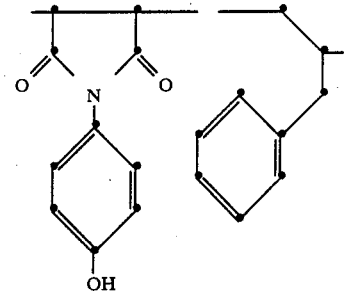

The following are polymerized analogously to the process of Example 4:

18.92 g (100 mmol) of p-maleinimidylphenol,
90.00 g (762 mmol) of allylbenzene and
0.39 g (2.4 mmol) of α,α'-azobisisobutyronitrile (AIBN).

After the product has been introduced into ether, filtered off and washed with ether, drying leaves 20.8 g of a colourless powder.

Elementary analysis

Found, %: C 71.15 H 5.72 N 5.12. Composition calculated from N content): 3.65 mol/kg maleinimidylphenol.

$\overline{M}_w = 4650$
$\overline{M}_n = 2746$ } GPC (polystyrene standards)

EXAMPLE 7

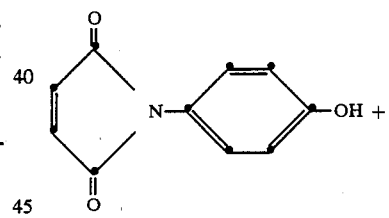

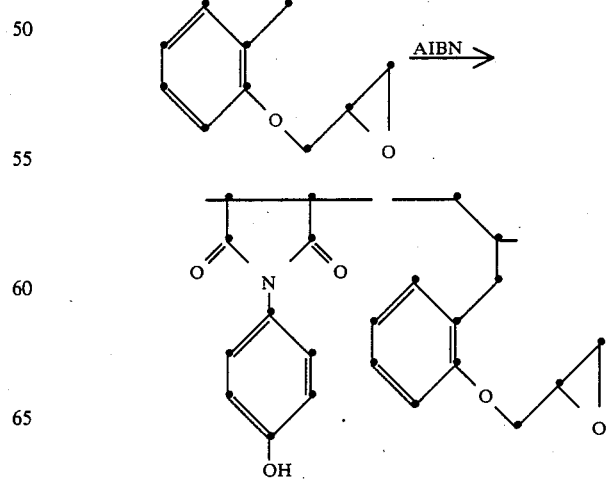

The following are polymerized analogously to the process of Example 5:
- 18.92 g (100 mmol) of p-maleinimidylphenol,
- 95.12 g (500 mmol) of 2-allylphenyl glycidyl ether,
- 0.38 g (2.3 mmol) of α,α'-azobisisobutyronitrile (AIBN) and
- 400 ml of tetrahydrofuran.

After the product has been introduced into ether, filtered off and washed with ether, drying leaves 17.2 g of a colourless powder.

Elementary analysis

Found, %: C 67.16 H 5.49 N 4.66. Composition (calculated from N content): 3.33 mol/kg maleinimidylphenol.

| $\overline{M}_w = 2614$ $\overline{M}_n = 1680$ | GPC (polystyrene standards) |
|---|---|

EXAMPLE 8

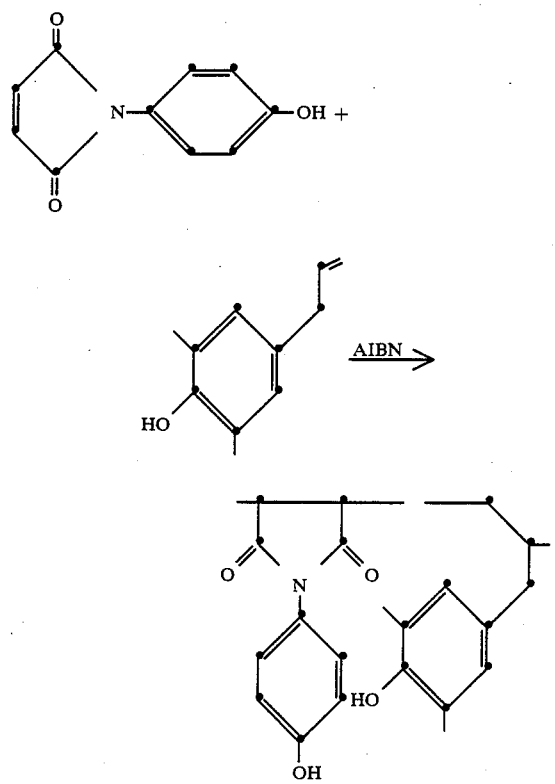

The following are polymerized analogously to the process of Example 5:
- 19.40 g (102.6 mmol) of p-maleinimidylphenol,
- 100.00 g (616 mmol) of 4-allyl-2,6-dimethylphenol,
- 0.39 g (2.4 mmol) of α,α'-azobisisobutyronitrile (AIBN) and
- 400 ml of tetrahydrofuran.

After the product has been introduced into ether, filtered off and washed with ether, drying leaves 27.3 g of a colourless powder.

Elementary analysis

Found, %: C 68.08 H 5.77 N 4.92. Composition (calculated from N content): 3.53 mol/kg maleinimidylphenol.

| $\overline{M}_w = 2578$ $\overline{M}_n = 1817$ | GPC (polystyrene standards) |
|---|---|

EXAMPLE 9

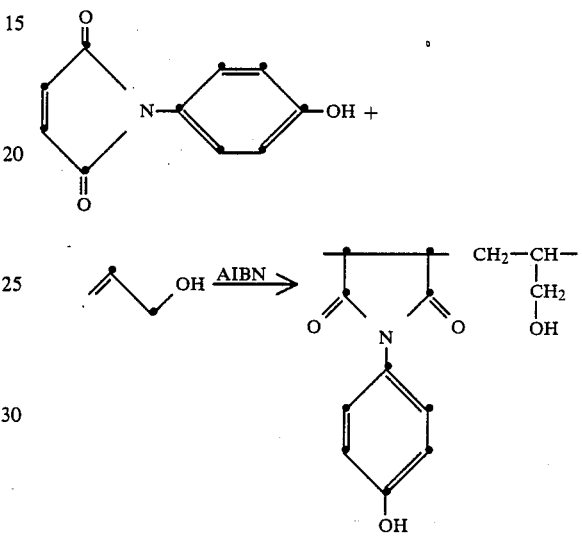

The following are polymerized analogously to the process of Example 1 for 24 hours at 70° C.:
- 189.17 g (1.0 mol) of p-maleinimidylphenol,
- 232.32 g (4.0 mol) of allyl alcohol,
- 600 g of 1-methoxypropanol (Dowanol ®PM) and
- 3.83 g of α,α'-azobisisobutyronitrile (AIBN).

After precipitation (diethyl ether) and drying (vacuum, 80° C. for 8 hours) 248.8 g of a solid copolymer are obtained.

Elementary analysis

Found (%): C 61.20 H 5.87 N 5.44. Composition (from N content):
- 3.88 mol/kg maleinimidylphenol
- 4.57 mol/kg allyl alcohol

| $\overline{M}_w = 2979$ $\overline{M}_n = 1826$ | GPC (polystyrene standards) |
|---|---|

EXAMPLE 10

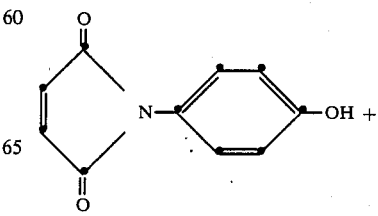

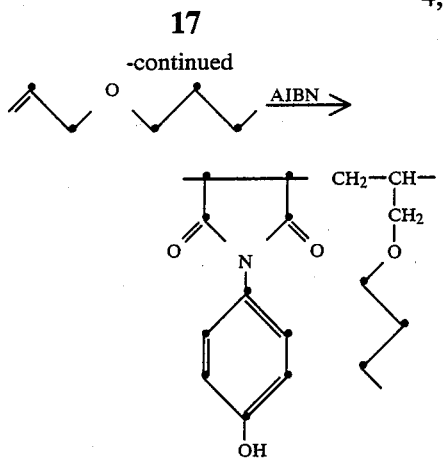

The following are polymerized analogously to the process of Example 1 for 24 hours at 70° C.:
9.45 g (0.05 mol) of p-maleinimidylphenol,
22.84 g (0.20 mol) of allyl butyl ether,
30.0 g of 1-methoxypropanol (Dowanol ®PM) and
0.235 g of α,α′-azobisisobutyronitrile (AIBN).

After precipitation (diethyl ether) and drying (vacuum, 100° C. for 6 hours) 11.6 g of a solid copolymer are obtained.

Elementary analysis

Found (%): C 63.91 H 6.18 N 5.38. Composition (from N content):
3.84 mol/kg maleinimidylphenol
2.39 mol/kg allyl butyl ether.

| $\overline{M}_w = 5744$ $\overline{M}_n = 3434$ | GPC (polystyrene standards) |
|---|---|

EXAMPLE 11

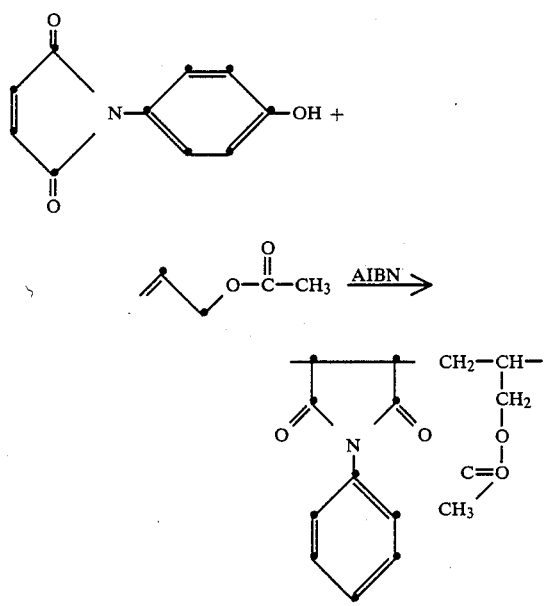

The following are polymerized analogously to the process of Example 1 for 24 hours at 70° C.:
9.45 g (0.05 mol) of p-maleinimidylphenol,
20.02 g (0.20 mol) of allyl acetate,
30.0 g of 1-methoxypropanol (Dowanol ®PM) and
0.22 g of α,α′-azobisisobutyronitrile (AIBN).

Precipitation in 1,000 ml of diethyl ether and drying at 100° C. in vacuo (6 hours) leaves 12.3 g of a colourless, solid copolymer.

Elementary analysis

Found (%): C 61.11 H 5.47 N 5.43. Composition, calculated from N content:
3.88 mol/kg maleinimidylphenol
2.66 mol/kg allyl acetate

| $\overline{M}_w = 5109$ $\overline{M}_n = 2978$ | GPC (polystyrene standards) |
|---|---|

Use examples
EXAMPLE A

This example illustrates use as a binder for formulating aqueous alkaline negative photoresists which can be developed and are based on epoxide resins.

| Coating solution | |
|---|---|
| Polymer from Example 1 | 1.80 g |
| 3,4-epoxycyclohexylmethyl 3,4-epoxycyclohexane-carboxylate | 1.20 g |
| Photoinitiator (Stilbene cyclopentadienyl iron-(II) hexafluorophosphate as a 10% solution in cyclohexanone) | 1.50 g |
| Orasolrot B dyestuff | 0.006 g |
| Methyl ethyl ketone/methylcellosolve | 5.50 g |

The solution is used to coat a cleaned, copper-lined printed circuit board in a wet film thickness of approx. 100 μm, under yellow light, by means of a film applicator. Drying at 80° C. for 30 minutes gives a dry film thickness of approx. 25 g/m². This photoresist-coated printed circuit board is exposed in a customary manner to a 5,000 watt halogen lamp (Silvania M 061) at a distance of 65 cm, through a photomask (Stouffer Sensitivity Guide) and is then subjected to heat treatment. The following solution is used as developer:
75.00 g of sodium metasilicate pentahydrate,
0.40 g of Suprionic ® B 50 (ABM Chemicals Ltd., Stockport, Cheshire UK); wetting agent, and
1925.00 g of demineralized water.

Result

Exposure time: 15 seconds
Heat treatment: 10 minutes/120° C.
Development time: 30 seconds/20° C. (by hand, with a cotton cloth)
Wedge copy: Last step forming an image: No. 9.

What is claimed is:
1. A copolymer which comprises
(a) a first structural unit of the formula

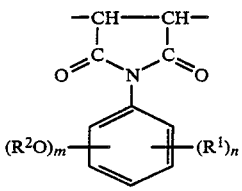

in which
R¹ is alkyl of 1 to 4 carbon atoms, alkoxy of 1 to 4 carbon atoms, or halo,
R² is hydrogen or CO-alkyl in which alkyl contains from 1 to 20 carbon atoms,
m has a value of 1 to 3, and
n has a value of 0 to 4, the sum of m and n not exceeding 5; and (b) a second structural unit of the formula $$-CH_2-CH-$$
$$\quad\quad |$$
$$\quad\quad CH_2$$
$$\quad\quad |$$
$$\quad\quad A$$

in which A is a glycidyl-containing member selected from the group consisting of

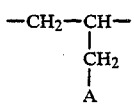 (i)

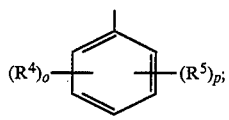 (ii)

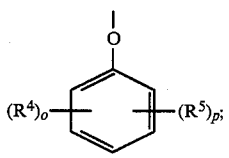 (iii)

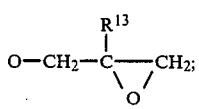 (iv)

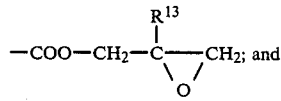

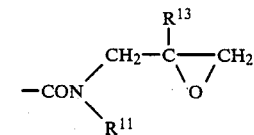 (v)

in which
R⁴ is

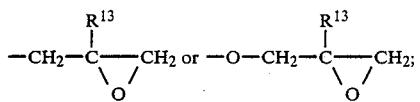

R⁵ is alkyl of 1 to 4 carbon atoms, alkoxy of 1 to 4 carbon atoms or halogen,
o has a value of 1 to 3;
p has a value of 0 to 4, the sum of o and p not exceeding 5;
R¹¹ is hydrogen, alkyl of 1 to 20 carbon atoms, cycloalkyl of 5 to 7 carbon atoms, unsubstituted or substituted aryl or aralkyl, or

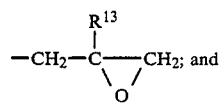

R¹³ is hydrogen or methyl, the mol % ratio of said first structural unit to said second structural unit being from 5:95 to 95:5.

2. A copolymer according to claim 1 containing up to 70 mol % of a third structural unit derived from one or more vinyl monomers selected from the group consisting of (i) styrene compounds; (ii) alpha, beta unsaturated acids, esters, amides or nitriles; (iii) halogen containing vinyl compounds, vinyl esters, vinyl ethers; and (iv) olefins.

3. A copolymer according to claim 1 wherein said first and second structural units constitute at least 50% of the copolymer.

4. A copolymer according to claim 1 wherein R² is hydrogen.

5. A composition according to claim 4 wherein A is

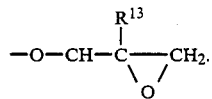

6. A composition according to claim 5 wherein R¹³ is hydrogen, m is 1, and n is 0.

7. A composition according to claim 4 wherein A is

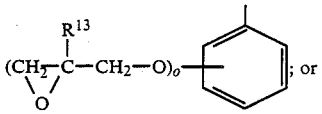; or

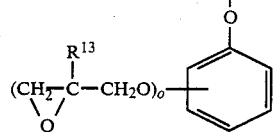

in which R¹³ is as therein defined and o has a value of 1 or 2.

* * * * *